United States Patent [19]

Harriott et al.

[11] Patent Number: 5,273,849
[45] Date of Patent: Dec. 28, 1993

[54] MASK REPAIR

[75] Inventors: Lloyd R. Harriott, Hillsborough Township, Somerset County; Michael J. R. Vasile, North Plainfield, both of N.J.

[73] Assignee: AT&T Bell Laboratories, Murray Hill, N.J.

[21] Appl. No.: 850,226

[22] Filed: Mar. 12, 1992

Related U.S. Application Data

[63] Continuation of Ser. No. 512,632, Apr. 23, 1990, abandoned, which is a continuation of Ser. No. 378,475, Jul. 12, 1989, abandoned, which is a continuation of Ser. No. 118,508, Nov. 9, 1987, abandoned.

[51] Int. Cl.$^5$ .............................................. G03F 9/00
[52] U.S. Cl. ............................... 430/5; 430/321; 427/140; 427/524; 250/492.2
[58] Field of Search ............... 430/5, 321; 427/38, 427/39, 43.1, 140; 250/492.2

[56] References Cited

U.S. PATENT DOCUMENTS

| | | | |
|---|---|---|---|
| 4,460,436 | 7/1984 | Hiraoka | 430/328 |
| 4,698,236 | 10/1987 | Kellogg et al. | 430/5 |
| 4,902,530 | 2/1990 | Yasaka et al. | 427/38 |
| 4,930,439 | 6/1990 | Sato et al. | 250/492.3 |
| 4,950,498 | 8/1990 | Kaito | 427/38 |
| 4,958,074 | 9/1990 | Wolf et al. | 250/309 |

FOREIGN PATENT DOCUMENTS 0153854  9/1985  European Pat. Off. .............. 427/38

OTHER PUBLICATIONS

L. Harriott, *Proceedings of SPIE*, 773 (1987).
D. J. Elliott, *Integrated Circuit Fabrication Technology*, McGraw-Hill, New York, 1982.
H. C. Kaufman, W. B. Thompson, and G. J. Dunn, *Proceedings of SPIE*, International Society of Optical Engineering, 632, 60 (1986).
M. Yamamoto, M. Sato, H. Kyogoku, K. Aita, Y. Nakugawa, A. Yasaka, R. Takusawa, O. Hattori, *Proceedings of SPIE*, Int'l. Society of Optical Engineering, 632, 97 (1986).

*Primary Examiner*—Charles L. Bowers, Jr.
*Assistant Examiner*—Thomas R. Neville
*Attorney, Agent, or Firm*—Bruce S. Schneider

[57] ABSTRACT

Repair of transparent errors in masks utilized for lithographic processes in the manufacture of devices is accomplished by a particularly expedient procedure. In this procedure a metal ion beam such as a gallium ion beam is directed to the region that is to be repaired. An organic gas, including a material having an aromatic ring with an unsaturated substituent, is introduced into this region. The interaction of the gas with the ion beam produces an opaque adherent deposit. The resolution for this deposition is extremely good and is suitable for extremely fine design rules, e.g., 1 μm and below.

13 Claims, 3 Drawing Sheets

MASK REPAIR

This application is a continuation of application Ser. No. 07/512,632, filed on Apr. 23, 1990, now abandoned, which is a continuation of Ser. No. 07/378,475, filed on Jul. 12, 1989 (now abandoned), which is a continuation of application Ser. No. 118,508, filed on Nov. 9, 1987 (now abandoned).

BACKGROUND OF THE INVENTION

1. Technical Field

This invention relates to the fabrication of lithographic masks and, in particular, the fabrication of lithographic masks utilized in device fabrication.

2. Art Background

In the fabrication of devices, e.g., semiconductor devices, magnetic bubble devices or optical devices, it is generally necessary to configure on a substrate a region (e.g., a metal, semiconductor or dielectric region) in a specific spatial pattern and location. (A substrate is a mechanically stable body including, e.g., semiconductor regions and/or metal regions and/or dielectric regions.) The positioning and/or patterning of these regions is generally accomplished by a lithographic process. In this process a mask is utilized to image energy in the desired pattern onto a substrate surface that has been coated with a material sensitive to the incident energy. The mask in this exposure step is generally placed in contact with or in close spatial relation to the substrate. Alternatively, the mask pattern is projected onto the substrate.

After exposure, development of the energy sensitive material is performed to selectively remove either the exposed, or unexposed regions, of the resist material. (For a negative resist the unexposed region is removed while for a positive resist the exposed region is removed.) Generally, a solvent or energetic entities from a plasma are employed to effect this removal. The resulting, patterned energy sensitive material, i.e., resist, is employable as a processing mask for accomplishing the processing, e.g., selective doping, etching, oxidizing of or deposition onto the underlying substrate regions.

The mask utilized for exposure of the resist material generally includes a patterned metal or metal oxide film. Materials such as chromium, chromium oxide, tungsten or nickel are typically used for photomasks. These materials are commonly formed in a layer thickness of approximately 500 Angstroms to 1000 Angstroms for photomasks on a transparent substrate such as a quartz glass substrate. (In the context of this disclosure, the terms transparent and opaque refer to the energy that is effective in inducing reaction in the resist material to be exposed. For a material to be considered opaque, it should transmit less than 10 percent of this energy while for the material to be considered transparent it should transmit at least 80 percent of this energy.) The metal or metal oxide film of the mask is typically manufactured by depositing a resist material sensitive to electrons onto its surface, exposing this resist material with a directed electron beam, and developing the exposed resist to form the desired pattern (see, D. J. Elliott, *Integrated Circuit Fabrication Technology*, McGraw-Hill, New York, 1982, for a description of the fabrication of photomasks).

In the manufacture of masks, transparent defects such as pin holes or entire missing portions often occur. These defects, in turn, cause defects in the integrated circuit or other device produced when using the mask. Since the manufacture of masks is generally a time-consuming and relatively expensive operation, it is often desirable to repair a defective mask by selectively forming an opaque material on the unwanted transparent region. The repair procedure is, however, not acceptable unless it is less costly than merely producing another mask. The repair should also produce an opaque deposit that is sufficiently adherent to the mask substrate that subsequent processing and cleaning during mask fabrication or during subsequent use of the mask does not induce loss of the repaired material. Additionally, the resolution of the repair procedure should be at least as good as the desired resolution of the mask itself to avoid mask and, in turn, device degradation.

A variety of processes have been disclosed for effecting repair of transparent defects. In one procedure, such as disclosed in U.S. Pat. application Ser. No. 735,851 dated May 20, 1985, which is the parent of U.S. Pat. application Ser. No. 086,210 dated Aug. 17, 1987, a laser is utilized to expose a metal ink on the mask surface. Although this procedure has been found quite efficacious for repair of masks formed with design rules of 1 $\mu$m or larger, repair of masks with finer design rules, e.g., 1 $\mu$m or finer, is more difficult. (A design rule is the feature size for the smallest feature (line or space) that must be delineated by the mask to form the desired device.) Another procedure, formation of carbonaceous films utilizing a focused ion beam, has also been discussed in H. C. Kaufman, W. B. Thompson, and G. J. Dunn, *Proceedings of SPIE*, International Society of Optical Engineering, 632, 60 (1986) and M. Yamamoto, M. Sato, H. Kyogoku, K. Aita, Y. Nakugawa, A. Yasaka, R. Takusawa, and O. Hattori, *Proceedings of SPIE*, International Society of Optical Engineering, 632, 97 (1986). However, essentially no details have been given concerning the conditions or materials utilized and these processes have been difficult to reproducibly control.

SUMMARY OF THE INVENTION

A rapid, expeditious procedure for forming an adherent opaque deposit in the repair of masks having design rules of 1 $\mu$m or finer is accomplished utilizing an ion beam technique. In this process an ion beam, including heavier metal ions, e.g., ions of atoms such as gallium, lead, indium, and gold, are utilized to impact the region of the mask to be repaired in the presence of an organic material. The organic material is introduced in the vapor phase and should include a composition having an unsaturated substituent bound to an aromatic ring or aromatic ring system. For example, organic materials such as benzofuran, indene, phenylacetylene, and styrene yield desirable results. In contrast, if a material that does not have an unsaturated moiety attached to an aromatic ring or aromatic ring system is utilized, such as benzene, toluene or methylmethacrylate, the material either does not form as a deposit or the resulting deposit is translucent.

The metal such as gallium from the ion beam induces a heterogeneous reaction in the impacted gas to produce a carbonaceous material that includes the metal entity. The resolution of this metal-containing deposit is commensurate with the spot size of the ion beam. The procedure is rapid and for appropriately chosen organic materials the deposition process is not excessively sensitive to the dose rate of the metal ion beam. The resulting deposit is opaque to exposing energies such as visible radiation, ultraviolet radiation, deep ultraviolet radiation, ion beams, and electron beams.

DETAILED DESCRIPTION

Figure 1:
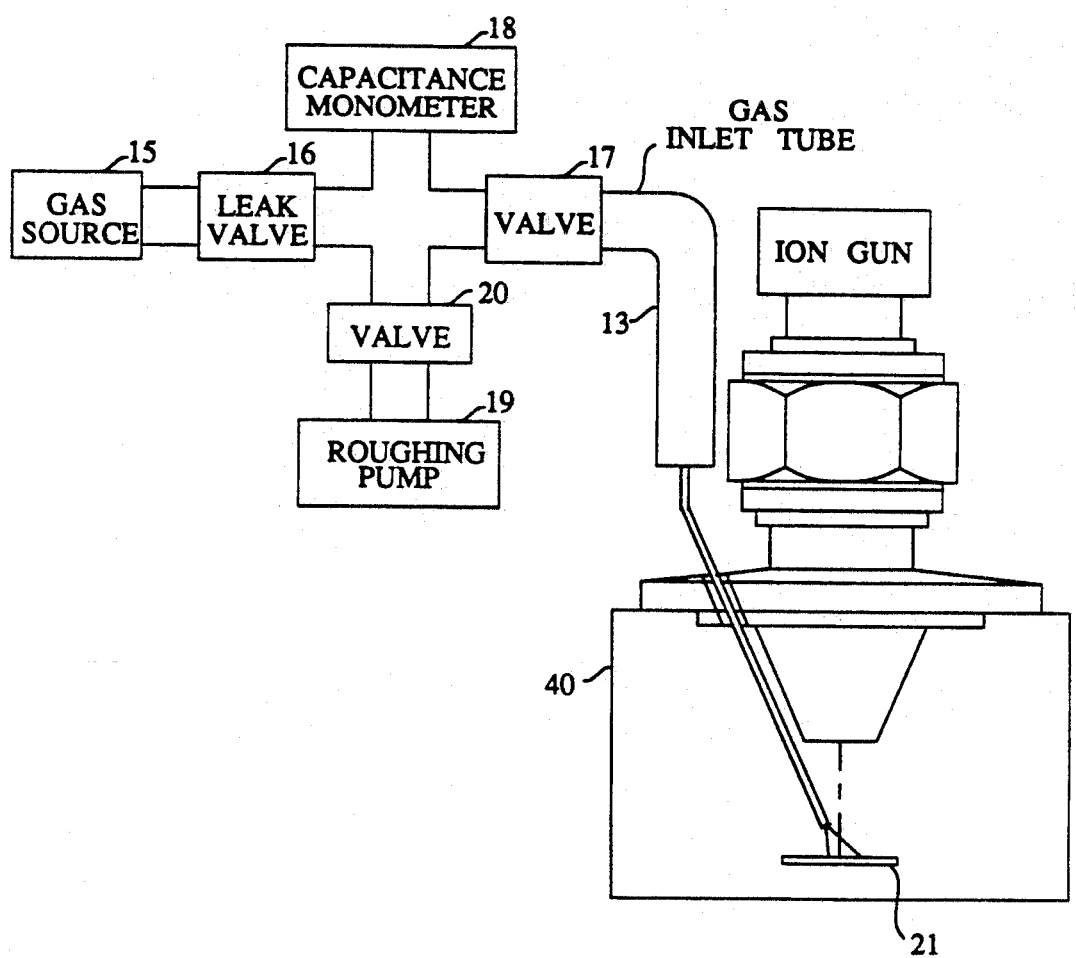
FIG. 1 is illustrative of an apparatus suitable for practicing the invention.

Repair of a mask such as a photomask (e.g., an ultraviolet photomask or a deep UV photomask) as well as an electron or ion transmission mask is effected by impacting in the region to be repaired an organic material with ions of heavier metals. The gaseous material employed should include an aromatic ring or aromatic ring system with a substituent having an unsaturated bond, e.g., a vinyl or acetylenic bond. Suitable materials include benzofuran, indene, phenylacetylene, and sytrene. For convenience, the source of the gaseous material should either be a gas or a material having a vapor pressure sufficiently high to allow introduction of a vapor into the region of the mask to be repaired. Generally, inlet pressures in the range 0.5 to 5 Torr are utilized. The size of the chamber does not substantially affect the desired inlet pressure provided the distance between the inlet and the region to be repaired is less than the internal diameter of the inlet tube. Typically, inlets with inner diameters in the range 25 $\mu$m to 1 mm are useful. The spacing is conveniently established by positioning the inlet the desired distance above the mask and translating the mask so that the area to be repaired is directly in the flow direction. Typically, to produce the desired flow rates, vapor pressures above 0.5 Torr are desirable. If a material that does not have an unsaturated bond in conjunction with an aromatic ring is employed, the resulting deposit either does not form such as in the case of benzene or toluene or the deposit is not opaque such as in the case of methylmethacrylate.

The deposit of repair material occurs in the region of the mask impacted by the metal ion. The deposition essentially does not spread beyond the impacted area. Thus, the resolution of the deposited material depends on the spot size of the ion beam, i.e., the diameter (or for non-circular spots the diameter of a circle having an equivalent area) of the region encompassed by the full width at half maximum of the beam current spatial profile. Typically, ion beam spot sizes smaller than 0.5 microns, indeed as small as 0.05 micrometer, are presently achievable. (See, L. Harriott, *Proceedings of SPIE*, 773 (1987), for procedures and equipment suitable for producing metal ion beams having these spot sizes.) Typically, acceleration voltages for the ion beam in the range 5 to 50 KeV is employed. Acceleration voltages below 5 KeV lead to excessive spot diameter while acceleration voltages above 50 KeV typically result in substantial implantation of ions into the mask.

To form a suitable deposition, the metal interacts with the organic material inducing reaction of the gas to form a carbonaceous deposit that includes at least a portion of the metal. Generally, ions of heavier metals such as gold, indium, gallium, and lead result in suitable deposition. Typically, the metal is present in the repair material at a concentration between 10 and 30 atomic percent. At concentrations substantially less than 10 atomic percent there is an undesirable loss of opacity.

The reaction essentially does not occur in the gas phase and is essentially entirely a heterogeneous reaction at the substrate surface. Thus, the extent of final deposition is determined by 1) the adsorption rate of the gas at the substrate, 2) the dose rate of the incident ions, 3) the sputtering rate, i.e., the rate of removal of the deposited material, and 4) the polymerization rate which, in turn, depends on the gas precursor.

The rate of formation of the repair material (as determined by the factors 1), 2), and 4)) should be greater than the rate of sputtering induced by the impacting ions. Typically, this result is achieved by utilizing organic gas flow rates in the range $10^{18}$ to $10^{19}$ molecules/cm$^2$-sec in conjunction with ion dose rates in the range $10^{18}$ to $10^{19}$ ions/cm$^2$-sec. The molecular flux should advantageously be higher than the ion flux. (Molecular fluxes in the range $10^{18}$ to $10^{19}$ molecules/cm$^2$-sec are advantageously achieved by employing the previously discussed inlet pressures.) Typically, to maintain a suitable deposition relative to sputtering rate, it is desirable to utilize multiple passes of the ion beam through the area to be repaired. In this manner, it is easier to ensure that the arrival rate of ions for typical beam current densities, i.e., densities in the range 0.1 to 1 amps/cm$^2$, is suitable for the typical gas flows discussed above. Generally, only 1 to 10 passes with scan rates of 0.1 to 1 $\mu$m$^2$/sec is required to produce an opaque deposit. These parameters correspond to a rate of approximately 10 $\mu$sec to 10 millisec per pixel. Thus, rapid scanning, i.e., scanning faster than 10 $\mu$sec/pixel, that often leads to loss of resolution and placement accuracy for the deposited material is avoided. (A pixel is half the full width at half maximum of the beam current spatial profile.) The extent of deposit depends on the total dose employed. Generally, sufficient material for opacity is deposited with a total dose in the range $10^{17}$ to $10^{18}$ ions/cm$^2$.

The following examples are illustrative of suitable conditions for the practice of the invention.

EXAMPLE 1

The apparatus of FIG. 1 was utilized to repair a mask. The apparatus included an ion source, collimator and lens. This ion beam equipment was described in L. Harriott, *Proceedings of SPIE*, 773 (1987). Standard acceleration, collimating, and focusing equipment were utilized. A gas inlet tube, 13, was introduced into the deposition chamber and positioned so that its end was approximately 100 microns from the point where the ion beam strikes the sample. The angle of the gas inlet tube was adjusted to make an angle of approximately 22 degrees relative to the major plane of the mask. The gas source, 15, included a gas bulb that was suitable for holding a liquid source of the reactant to be utilized. A leak valve, 16, and a valve, 17, was supplied for controlling the flow of this reactant to the mask to be repaired. A capacitance monomer, 18, was utilized to monitor gas pressure and a roughing pump, in conjunction with valve, 20, was utilized to evacuate the reactant supply system.

In operation, a cryogenic pump was utilized to evacuate chamber, 40, to a pressure of approximately $10^{-7}$ Torr. Utilizing a load lock system, a chromium mask having a variety of lines and spaces with the smallest space being approximately 1 micron was positioned on the sample holder, 21. The roughing pump, 19, was activated while valves, 16 and 17 were closed. Approximately 2 milliliters of research grade styrene was introduced into the gas source tube, 15. The tube was then immersed in liquid nitrogen. Valve, 16, was opened to remove any air present in the gas source system. The liquid nitrogen was then removed and the leak valve, 16, was closed when the styrene began to melt. This procedure of freezing and air removal was repeated a second time. Valve, 20, was closed, valve, 17, opened and valve, 16, adjusted so that the capacitance monomer read a pressure of 2 Torr of styrene.

A gallium ion beam (beam current of 0.5 amp/cm$^2$) was focused at the mask surface. The focused beam was then utilized to position the mask portion to be repaired directly in the beam path. The beam was also utilized to position the gas inlet tube at the position described previously. (This positioning of the substrate and of the inlet tube is performable either before or after the styrene flow is initiated. Since a rapid scan is utilized for positioning, even with the styrene present a negligible amount of deposition occurs.) The region to be repaired measured approximately 2 by 10 microns and was scanned at a rate of approximately 10 milliseconds per pixel with 10 passes being utilized. The ion beam was then terminated, the leak valve, 16, was closed, and the system again evacuated utilizing roughing pump, 19, and the cryogenic pump present on deposition chamber, 40.

Figure 2:
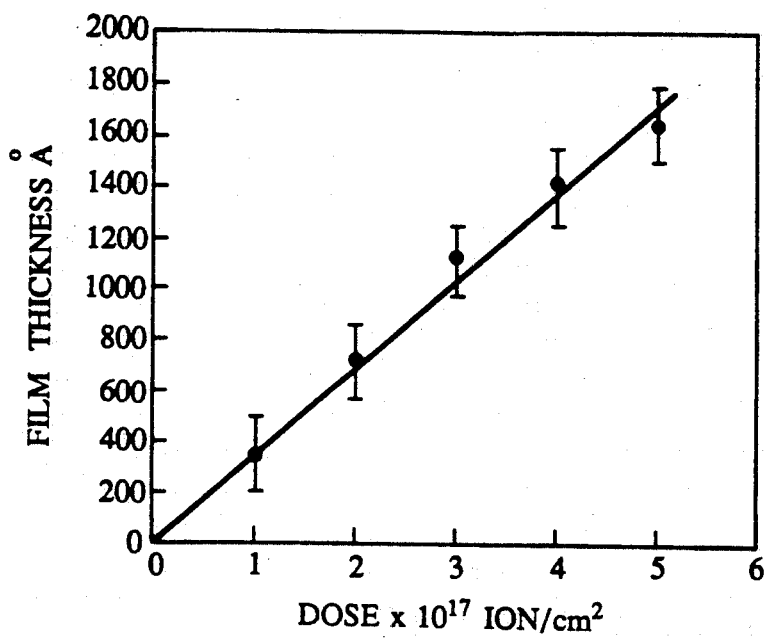
FIGS. 2 through 5 are illustrative of results obtained by such practice.
Figure 3:
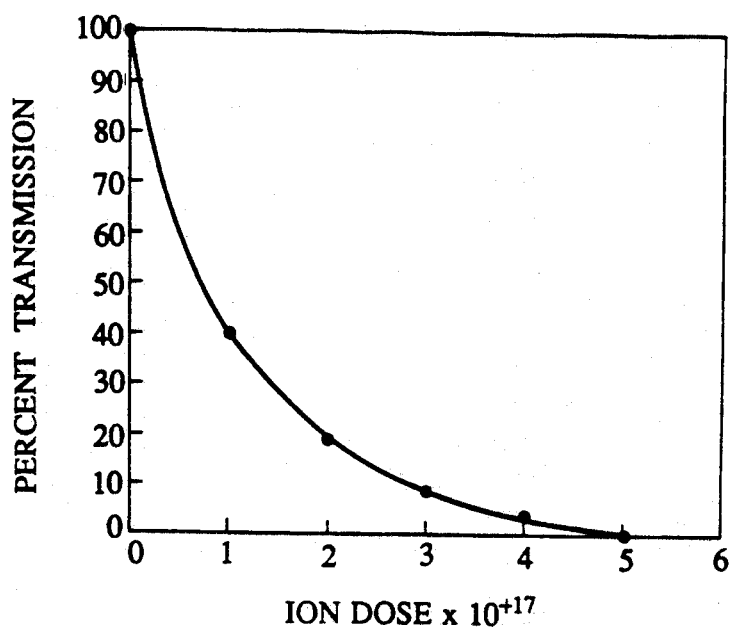
Figure 4:
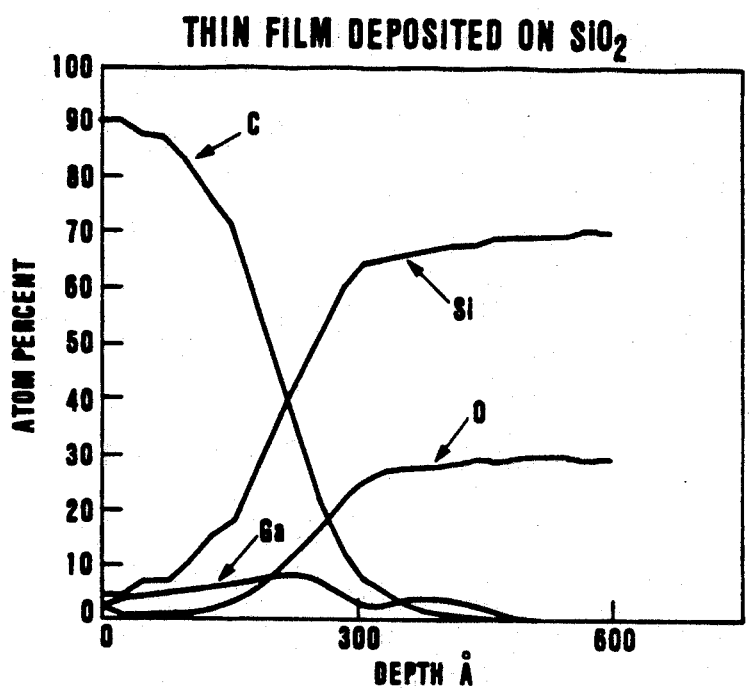
Figure 5:
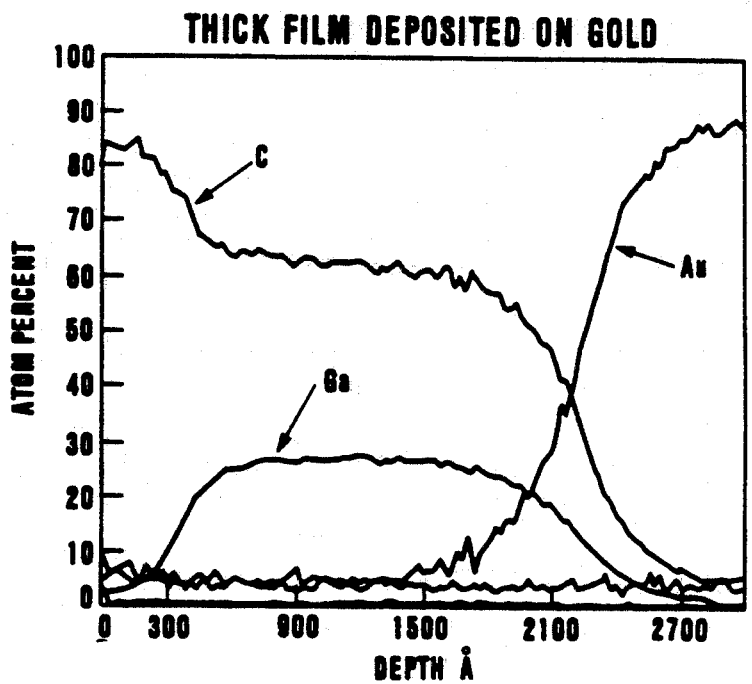

Using this repair procedure the scan rate was varied in a series of exposures to yield total doses in the range 1 to $5 \times 10^{17}$ ions per centimeter square. The relationship of total dose to the film thickness obtained is shown in FIG. 2. The same series of depositions were repeated and the percent transmission of the deposit depending on the dose being utilized is shown in FIG. 3. One of the films produced by the above-described procedure having a thickness of approximately 200 Angstroms was subjected to Auger depth profiling. The results are shown in FIG. 4. It should be noted that for extremely thin films (200 Angstrom films) the gallium concentration is somewhat lower than is typically obtained for thicker films. That is, the gallium concentration is approximately 10 atomic percent as opposed to a more typical 20 to 30 atomic percent, as shown in FIG. 5, for a film thickness of 2000 Angstroms. The 200 Angstrom deposited film was sufficiently thin to still be essentially transparent. Thus, thicker films are typically required to produce a suitable opacity. (The Auger and thickness experiments were performed for repairs having significantly larger feature sizes, e.g., approximately 100 microns, so that the resolution of the measuring equipment was not exceeded.)

EXAMPLE 2

The procedure of Example 1 was followed except individual runs were performed utilizing benzofuran, indene, and phenylacetylene rather than styrene as the gaseous reactant. In each case, the results achieved were essentially identical to that of Example 1. For some of these gases, because of their relatively low vapor pressure, the partial pressure utilized during depositions was somewhat lower than 2 Torr.

EXAMPLE 3

The procedure of Example 1 was utilized except runs employing methylmethacrylate, benzene, and toluene were performed. For the benzene and toluene runs no noticeable deposition occurred even when the number of passes was increased to 1000. Indeed, some of the mask substrate was removed due to sputtering processes. For methylmethacrylate, deposits were obtained, however, these deposits were transmissive and the opacity was not substantially increased even with significant increase of total dose.

What is claimed is:

1. A process for fabricating a patterned mask suitable for use in the lithographic fabrication of a device comprising the steps of forming said pattern for said mask, and repairing a transparent defect in said pattern characterized in that said repair is performed by impacting the region of said mask containing said defect with a metal ion beam in the presence of an organic gas to establish an opaque material contributing to a deposit remaining after said impacting wherein said organic gas comprises a composition selected from the group consisting of styrene, benzofuran, phenylacetylene, and indene induces a chemical reaction in said gas that results in said opaque material deposit, wherein said deposit includes entities of said metal and wherein said ion beam has a current density of at least 0.1 amp/cm$^2$.

2. The process of claim 1 wherein said device comprises a semiconductor device.

3. The process of claim 1 wherein said mask comprises a photolithography mask.

4. The process of claim 3 wherein said metal ion comprises an ion including a member chosen from the group consisting of lead, indium, gallium, and gold entities.

5. The process of claim 1 wherein said metal ion comprises an ion including a member chosen from the group consisting of lead, indium, gallium, and gold entities.

6. The process of claim 1 wherein said mask is suitable for fabricating a device having a design rule of 1 $\mu$m or smaller.

7. The process of claim 1 wherein the concentration of said metal present in said deposit is in the range 10 to 30 atomic percent.

8. A mask comprising a patterned layer on a substrate, said pattern comprising a primary material and a region of an opaque composition adherent to said material or to said substrate wherein said opaque composition comprises a carbonaceous material that includes a metal entity, and wherein said opaque composition is formed by impacting said region with a metal ion beam in the presence of an organic gas comprising a composition selected from the group consisting of styrene, benzofuran, phenylacetylene and indene wherein said ion beam has a current density of at least 0.1 amp/cm$^2$.

9. The mask of claim 8 wherein said metal entity comprises a moiety chosen from the group consisting of gallium, indium, lead, and gold entities.

10. The mask of claim 9 wherein said primary material comprises a metal or a metal oxide.

11. The mask of claim 8 wherein said primary material comprises a metal or metal oxide.

12. The mask of claim 11 wherein said metal comprises chromium, chromium oxide, tungsten or nickel.

13. The mask of claim 8 wherein said organic gas comprises one or more of styrene, benzofuran, phenylacetylene, or indene.

* * * * *